(12) United States Patent
Tudhope et al.

(10) Patent No.: US 11,348,759 B2
(45) Date of Patent: May 31, 2022

(54) SYSTEMS AND METHODS FOR COATING SURFACES

(71) Applicant: AGM CONTAINER CONTROLS, INC., Tucson, AZ (US)

(72) Inventors: Andrew Tudhope, Tucson, AZ (US); Thomas B. Casserly, Tucson, AZ (US); Marion D. McEuen, Tucson, AZ (US); Jeffrey F. Vogler, Tucson, AZ (US)

(73) Assignee: AGM CONTAINER CONTROLS, INC., Tucson, AZ (US)

( * ) Notice: Subject to any disclaimer, the term of this patent is extended or adjusted under 35 U.S.C. 154(b) by 266 days.

(21) Appl. No.: 16/499,669

(22) PCT Filed: Apr. 2, 2018

(86) PCT No.: PCT/US2018/025747
§ 371 (c)(1),
(2) Date: Sep. 30, 2019

(87) PCT Pub. No.: WO2018/184023
PCT Pub. Date: Oct. 4, 2018

(65) Prior Publication Data
US 2020/0118793 A1 Apr. 16, 2020

Related U.S. Application Data

(60) Provisional application No. 62/479,882, filed on Mar. 31, 2017.

(51) Int. Cl.
*H01J 37/32* (2006.01)
*C23C 16/503* (2006.01)
*C23C 16/04* (2006.01)

(52) U.S. Cl.
CPC ...... *H01J 37/32027* (2013.01); *C23C 16/503* (2013.01); *H01J 37/32* (2013.01);
(Continued)

(58) Field of Classification Search
CPC ............... H01J 37/32568; H01J 37/32; H01J 37/32403; H01J 37/3244; H01J 37/32394;
(Continued)

(56) References Cited

U.S. PATENT DOCUMENTS 5,527,439 A    6/1996  Sieck et al.
5,587,207 A *  12/1996 Gorokhovsky ......... C23C 16/02
                                                        118/50
(Continued)

FOREIGN PATENT DOCUMENTS

CN      1293717 A    7/2004
CN    101541350 A    9/2009
(Continued)

OTHER PUBLICATIONS

D. Lusk et al: "Thick DLC films deposited by PECVD on the internal surface of cylindrical substrates" (2008) Science Direct, Diamond and Related Materials, 1613-1621.

*Primary Examiner* — Yuechuan Yu
(74) *Attorney, Agent, or Firm* — Nguyen Tarbet LLC

(57) ABSTRACT

A chemical vapor deposition system for coating one or more workpieces is described herein. The deposition system includes a plurality of processing chambers which may be operated independently to increase throughput of the deposition system. Each chamber includes a modular fixture that is configured to maintain the workpieces in a predetermined arrangement which allows for a hollow cathode effect to be maintained in an Interior space of the chamber. The deposition system achieves significantly faster, higher-quality deposition and more complete, conformal coverage.

20 Claims, 11 Drawing Sheets

(52) U.S. Cl.
CPC .... *H01J 37/3244* (2013.01); *H01J 37/32403* (2013.01); *H01J 37/32568* (2013.01); *H01J 37/32596* (2013.01); *H01J 37/32899* (2013.01); *C23C 16/04* (2013.01); *H01J 37/3288* (2013.01); *H01J 37/32477* (2013.01)

(58) Field of Classification Search
CPC ........... H01J 37/32899; H01J 37/32596; H01J 37/32027; H01J 37/3288; H01J 37/32477; C23C 16/503; C23C 16/04
See application file for complete search history.

(56) References Cited

U.S. PATENT DOCUMENTS

| | | | |
|---|---|---|---|
| 5,934,856 A | 8/1999 | Asakawa et al. | |
| 6,027,618 A | 2/2000 | Aruga et al. | |
| 6,045,667 A | 4/2000 | Moll | |
| 6,129,856 A | 10/2000 | Jung et al. | |
| 7,300,684 B2 | 11/2007 | Boardman et al. | |
| 7,566,900 B2 | 7/2009 | Le et al. | |
| 8,343,593 B2 | 1/2013 | Boardman et al. | |
| 9,076,991 B2 | 7/2015 | Kurita et al. | |
| 9,230,835 B2 | 1/2016 | Gelatos et al. | |
| 2005/0051517 A1 | 3/2005 | Oehrlein et al. | |
| 2006/0011468 A1* | 1/2006 | Boardman | C23C 16/503 204/192.12 |
| 2007/0046927 A1 | 3/2007 | Le et al. | |
| 2007/0222358 A1 | 9/2007 | Shonka et al. | |
| 2007/0262059 A1 | 11/2007 | Boardman et al. | |
| 2008/0029494 A1 | 2/2008 | Tudhope et al. | |
| 2009/0311443 A1 | 12/2009 | Boardman et al. | |
| 2010/0173495 A1 | 7/2010 | Thakur et al. | |
| 2010/0276283 A1 | 11/2010 | Muenz et al. | |
| 2012/0064245 A1* | 3/2012 | Coutu | C23C 16/45504 427/248.1 |
| 2013/0146443 A1 | 6/2013 | Papa et al. | |
| 2014/0076718 A1 | 3/2014 | Gorokhovsky et al. | |

FOREIGN PATENT DOCUMENTS

| | | |
|---|---|---|
| CN | 102112648 A | 6/2011 |
| CN | 102534570 A | 2/2014 |
| CN | 103276373 A | 8/2015 |

\* cited by examiner

SYSTEMS AND METHODS FOR COATING SURFACES

CROSS REFERENCE

This application is a 371 and claims benefit of PCT/US18/25747 filed Apr. 2, 2018, which claims benefit of U.S. Provisional Patent Application No. 62/479,882, filed Mar. 31, 2017, the specification(s) of which is/are incorporated herein in their entirety by reference.

FIELD OF THE INVENTION

The present invention relates to systems and methods for coating surfaces, more specifically, for coating surfaces of workpieces having complex geometries including simultaneously coating internal and external surfaces using hollow cathode techniques.

BACKGROUND OF THE INVENTION

Plasma Enhanced Chemical Vapor Deposition (PECVD) methods of coating external surfaces of a workpiece within a vacuum chamber are well known. The coating of internal surfaces of hollow workpieces using PECVD technique has been described in co-owned U.S. Pat. No. 7,300,684 to Boardman et al., the specification(s) of which is/are incorporated herein in their entirely by reference, which utilizes a high deposition rate PECVD technique. The method involves using the pipe itself as a vacuum chamber, coupling the gas supply to one opening and the vacuum pump to another, and employing a voltage biasing system connected with the negative terminal attached to the pipe and with return anode(s) located at the ends of the pipe. Hydrocarbon precursors can be introduced and the voltage biasing system is used to generate a high density hollow cathode plasma and attract hydrocarbon ions to the surface to from a diamond-like carbon (DLC) film.

In many cases, it is necessary to coat both the internal and external surfaces of a hollow workpiece. Previously, this required the coating of each surface separately using different processing techniques. The method described in U.S. Pat. No. 6,129,856 to Jung et al. describes a method of coating an internal surface which may result in some unintentional coating of the external surface of the tube, since the entire part is contained within a vacuum chamber. While the Jung et al. method has advantages as compared to other approaches, the thickness of the external coating may be non-uniform and may be less than the thickness of the internal coating, as the gas flow is directed through the inside of the hollow body so that most of the gas will be consumed within the tube. Also, the high ion density hollow cathode plasma rapidly decays after exiting the hollow cathode source, which is in proximity to the internal coating.

One possible method of achieving uniform coating is using hollow cathode effect as described in co-owned U.S. Pat. No. 8,343,593 to Boardman et al., the specification(s) of which is/are incorporated herein in their entirety by reference. As described in this reference, the hollow cathode effect occurs when at least two cathode surfaces are positioned opposite to each other and are electrically cooperative with spaced apart anodes, such that an "oscillation motion" of electrons is achieved to increase ionization rates within a plasma. Therein, a spacing between the inner chamber wall and the exterior surface of the workpiece is fixed so as to control the plasma intensity, as well as plasma focusing. By fixing the spacing, it is possible to achieve coating of workpieces that have simple geometry. However, it may not always be possible or desired to keep the spacing constant. As an example, for workpieces that have a complex three-dimensional shapes and geometry, it may be difficult to maintain constant spacing.

In addition. Boardman et. al in U.S. Pat. No. 8,343,593 teaches a deposition system having a pipe within a pipe configuration. While the chamber of Boardman can include multiple workpieces, the workpieces must be in series in order to maintain a critical spacing between the outer pipe and the inner pipe and the workpieces cannot be in parallel. Thus, for a relatively long pipe, the chamber must be sized appropriately, which may not be economically feasible. The pipe must be divided into shorter lengths and the pipe segments can only be coated one at a time.

The present invention discloses systems and methods for simultaneously and uniformly coating workpieces that may have complex geometries (e.g., screws, hammers, gun trigger assemblies, bolts, bolt carriers, slides, levers, magazines, etc) by varying the spacing between the inner chamber wall and the exterior surfaces of the workpieces. As such, the spacing is varied by mounting the workpieces on racks or fixtures, where the racks are modular and designed based on the complex geometries of the workpieces. Even though the spacing is varied, the hollow cathode conditions within the chamber are still maintained by regulating the cathode power or voltage, pulse waveform, pressure within the chamber, and/or adjusting chamber load. Further, the deposition system of the present invention may include multiple workpieces with complicated geometries arranged in parallel, and in series configurations. Furthermore, the system allows for even a single workpiece with a complex geometry to be coated. Further still, the system allows even workpieces with simple geometries, such as cylindrical pipes, to be coated simultaneously while arranged in a parallel configuration. Thus, the deposition system of the present invention advantageous reduces the required size of the chamber, and may result in higher output and faster processing times.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

SUMMARY OF THE INVENTION

The present invention discloses a chemical vapor deposition system for coating one or more workpieces. As such, the system includes a plurality of chambers that may be operated independently to increase throughput of the system. In some embodiments, the plurality of chambers may be operated in sequence, in parallel or in combinations of parallel and sequence configurations, to further streamline the deposition process. For instance, two or more chambers may be operated in sequence, in parallel, or in parallel with addition in sequence.

In some aspects, the present invention discloses a chemical vapor deposition system for coating one or more workpieces. As will be disclosed herein, the system may include an openable hollow chamber comprising (i) a first end, (ii) an opposing second end, (iii) an interior space between the first end and the second end, and (iv) a movable door for accessing the interior space of the chamber. The system may additionally include a modular, tubular shield lining an interior surface of the chamber, wherein the tubular shield is sized to fit within the interior space of the chamber, wherein the tubular shield may be effective to prevent deposition of the coating onto the interior surface of the chamber. The system may further include one or more anodes positioned on the first and second ends of the chamber and a DC power supply operably coupled to the chamber wherein the DC power supply is configured to apply a negative pulse for biasing the one or more workpieces and the chamber as cathodes. The one or more workpieces may be loaded and unloaded from the chamber via the moveable door and the workpieces may be positioned inside the interior space of the chamber in a predetermined arrangement that allows for a hollow cathode effect to occur in the interior space of the chamber In some embodiments, a reactive gas may be introduced into the interior space of the chamber at a pressure controlled to achieve a plasma that uniformly coats the one or more workpieces wherein the movable door and tubular shield allows for ease of cleaning and inspection of the interior space of the chamber. One or more of an external surface and an internal surface of the workpieces, in any arrangement, may be coated. The DC power supply may be further configured to apply a reverse pulse to the cathodes to discharge growing coating.

In some embodiments, a geometry of the chamber may include a circular cross-section, wherein a longitudinal axis of the chamber extends perpendicular to the circular cross section. The tubular shield may be centered along the longitudinal axis. The tubular shield may include a first panel for lining a portion of the interior surface of the chamber, and a second panel for lining the remaining portion of the interior surface. In some embodiments, the tubular shield may include a foil fitted within the interior space of the chamber and wherein the foil may be removed via the door and recycled or discarded after the coating is applied to the one or more workpieces. After coating, the tubular shield may be removed from the chamber via the movable door of the chamber, and wherein the tubular shield may be reworked and reused for a subsequent coating process.

In some embodiments, the negative pulse applied to cathodes may be adjusted to maintain the hollow cathode effect within the interior of the chamber. The system may further include a rack for supporting and holding the workpieces in the predetermined arrangement inside the chamber. The predetermined arrangement may include a spacing between the workpiece and the tubular shield, and a predetermined spacing between workpieces. The reactive gas may be delivered via one or more gas lines coupled to the chamber.

According to some embodiments, a chemical vapor deposition system for coating one or more workpieces is provided. The system may include a plurality of processing chambers, wherein each chamber of the plurality of processing chambers is hollow and includes (i) a first end, (ii) a second opposite end, (iii) an interior space between the first end and the second end, (iv) a movable door for accessing the interior space of the chamber. (v) a shield lining an inside of the chamber, and (vi) one or more fixtures coupled to one or both of the first end the second end. The fixtures may be configured to position one or more workpieces within the interior space, wherein the fixtures may be modular and further configured to vary a spacing between individual workpieces of the one or more workpieces.

In some embodiments, the system may include a plurality of anodes operatively coupled to each of the plurality of processing chambers, and a DC power supply operatively coupled to each of the plurality of processing chambers. In some embodiments, when the workpieces are positioned inside at least one of the processing chambers, the DC power supply may be configured to apply a large negative pulse for biasing said chamber and the one or more workpieces as cathodes. The plurality of processing chambers may be each operatively coupled to a gas line, wherein the gas line may be configured to supply reactive gas to the interior space of the chamber at a pressure controlled to achieve a plasma that uniformly coats the one or more workpieces. The spacing of the workpieces relative to each other and to the chamber and the voltage applied to the anodes and the cathodes may be selected to maintain a hollow cathode effect in the interior space.

In some embodiments, the plurality of processing chambers may be individually and independently operable to coat the workpieces, wherein when at least one chamber is being used to coat the workpieces, the remaining chambers are not biased, thus allowing for independent operation of each chamber, wherein the processing chambers can operate in parallel or in series to each other. In some embodiments, at least two of the chamber may be operated together in parallel, and the other chambers may be loaded or receiving maintenance. The chamber may be configured to be operated in a sequence of parallel operations.

In some embodiments, each chamber may be operably coupled to a vacuum pump, and when the one or more workpieces are coated within the chamber, the vacuum pump may be operated to maintain the interior space of the chamber in vacuum. For each chamber of the plurality of processing chambers, one or more workpieces may be loaded and unloaded via the moveable door. The shield may be a foil fitted within the interior space of the chamber and wherein the foil may be removed via the door and recycled or discarded after the coating is applied to the one or more workpieces.

In some embodiments, the shield may be modular and tubular in shape, and may include a first panel and a second panel that overlap and interlock to create a shield within the chamber, wherein after coating, the tubular shield lining may be removed from the chamber via the movable door of the chamber, and wherein the tubular shield may be reworked and reused for a subsequent coating process. In some embodiments the shield may a foil, which is low cost and disposable. As used herein, the term "foil" refers to a thin metal piece, also called a shim stock. A material used to make the foil may be selected based on stiffness and durability properties of the material. As an example, the material which has higher stiffness and lower durability may be used to make the foil, so that the foil is able to hold its shape, and is additionally low cost. In other embodiments, the foil material can be biased a cathode.

In some embodiments, a design of the fixture may be based on a geometry of the one or more workpieces and further configured to maintain a threshold spacing between individual components of the workpieces. The geometry the threshold spacing may be selected from either a minimum dimension of the individual components of the workpieces or a fixed separation value, whichever is lower, wherein the threshold spacing is configured to maintain the hollow cathode condition within the interior space.

In some embodiments, the gas line may be configured to supply a cleaning gas to each chamber of the plurality of processing chambers, wherein the cleaning gas is configured to clean the interior space of the chamber prior to and after each deposition run. The gas line may be further configured to supply an adhesion gas to each chamber of the plurality of processing chambers, wherein the adhesion gas may be supplied to the chamber prior to coating the one or more workpieces, and wherein the adhesion gas configured to enhance the coating on the one or more workpieces.

According to some embodiments, a deposition system for applying coatings to workpieces is provided. The system may include one or more processing modules where each processing module may include a chamber, wherein the chamber includes a movable door. Each processing module may be configured to operate individually such that the chamber of one processing module is independent of the chamber of another processing module, wherein while processing module is processing and coating a first set of workpieces positioned within the chamber, the other processing module may be available for loading or unloading a second set of workpieces or for receiving maintenance, thereby increasing throughput of the deposition system.

In some embodiments, the system may include a gas module comprising one or more of a cleaning gas (or gas mixture), an adhesion gas (or gas mixture), and a coating gas (or gas mixture), the gas module operably coupled to each of the processing modules via a first valve, wherein the first valve may be configured to divert one or more of the cleaning gas(es), the adhesion gas(es), and the coating gas(es) only to the chamber(s) being used for coating workpieces.

In some embodiments, the system may include a pressure module comprising a vacuum pump. The vacuum pump may be operably coupled to each of the processing modules via a second valve. In one embodiment, the second valve may be configured to apply a vacuum, via the vacuum pump, only to the chamber being used for coating workpieces. In some embodiments, the second valve may comprise one or more valves. For example, the vacuum pump may be operably coupled to each of the processing modules via a roughing bypass valve and an isolation pressure control valve connected in series. In some embodiments, a common foreline may be coupled to each chamber of the processing module. In addition, each chamber may include the roughing/bypass valve and the isolation/pressure control valve. The isolation/pressure control valve may be a combo valve which replaces separate isolation and control valves. In other embodiments, the valves may include pendulum isolation valves which have dual action. For example, the pendulum isolation valves create a full seal when in the "closed" position and also move the position of a paddle to control pressure applied to the chamber.

In some embodiments, the system may include a power module comprising (i) anodes operatively coupled to each of the processing modules and (ii) a DC power supply operably coupled to each of the processing modules, wherein the power module may be configured to apply bias to only the chamber being used for coating and workpieces that are being coated as cathodes, wherein the power module further adjusts voltage applied to the anodes and the cathodes to maintain hollow cathode conditions within an interior space of the chamber in use, In some embodiments, the system may include a controller module operably coupled to the one or more processing modules, the gas module, the pressure module, and the power module, wherein the controller has memory that stores computer readable instructions that, when executed by the controller, causes the controller to load and unload coating recipes using an interface, the recipes designed based on complex geometries of the workpieces.

In some embodiments, each processing module may further include a modular fixture, the modular fixture designed based on the complex geometries of the workpieces, and further configured to maintain a threshold spacing between individual components of the workpieces, the threshold spacing selected from either a minimum dimension of the individual components of the workpieces or a fixed separation value, whichever is lower, wherein the threshold spacing is configured to maintain the hollow cathode condition within the interior space.

In some embodiments, each processing module may further include a modular lining shield, wherein the shield is fitted within the interior space of the chamber, wherein the shield includes a first panel and a second panel that overlap and interlock to create a shield within the chamber. When the coating process is completed, the first panel and the second panel may be disassembled, cleaned, and reused for subsequent deposition run. In other embodiments, the modular lining shield comprises a foil fitted within the interior space of the chamber and wherein the foil is removed via the door and recycled or discarded after the coating is applied to the one or more workpieces.

According to some embodiments a method of coating one or more workpieces is provided. The method may include providing a chamber having an interior space and an interior surface, lining the interior surface of the chamber with a modular shield, and positioning the one or more workpieces inside said chamber. A spacing between the modular shield and an adjacent surface of each workpiece may be variable along an axial direction, wherein said adjacent surface of the workpiece may be a surface or portion of a surface that is closest to or faces towards the modular shield. A spacing between neighboring workpieces is typically the greater one of: i) a minimum dimension of the workpiece; or ii) a predetermined, fixed distance. In some embodiments, the method may include establishing conditions to maintain a hollow cathode effect in the interior space thereby defining a hollow cathode effect region. The said conditions may include biasing anodes at opposite ends of said hollow cathode effect region and including biasing said interior surface and each of said workpieces as cathodes, wherein establishing said conditions further includes pressurizing plasma residing within said spacing.

In some embodiments, said biasing may include maintaining said interior surface and each said workpiece at a common bias voltage and the minimum dimension may be a width, depth, or length of the workpiece. In some embodiments, the fixed distance may be about % to about 2 inches. The workpieces may be arranged in parallel configuration within the interior space of the chamber. In some embodiments, the workpieces may be arranged in a plurality of rows and columns. In some embodiments, the method may include coating one or more of internal and external surfaces of any arrangement of the workpieces.

One of the unique and inventive technical features of the present invention is the system includes multiple chambers wherein some or all of the chambers may be operated in sequential and/or parallel configuration, where each chamber is coupled to customized racks for holding the workpieces of different geometries. In this way, the system allows for a high-speed streamlined processing of the workpieces. Without wishing to limit the invention to any theory or mechanism, it is believed that the technical feature of the present invention advantageously provides for enhancing throughput of the system and maximizing utility of different components of the system. Additionally, the system provides for ease of changeover from one process chamber (or set of process chambers) to the next. Herein, the same chamber may be used to coat workpieces of different geometries by merely changing the fixture. Furthermore, the system allows live processing of one chamber (or set of chambers) while the operator(s) have access to the other chamber(s) in order to turn the over and prepare for the next deposition process, thereby decreasing downtime and increasing throughput of the system. None of the presently known prior references or work has the unique inventive technical feature of the present invention.

Boardman et. al in U.S. Pat. No. 8,343,593 discloses coating surfaces of workpieces that have simple cylindrical geometries, Boardman does not teach complex geometries, in fact, Boardman requires concentricity between the workpiece and chamber. In addition, Boardman teaches that having a fixed spacing between workpiece and chamber is critical for generation of hollow cathode condition within the chamber. Current thinking combined with the teachings of Boardman allude that the workpieces have to be concentric to avoid non-uniform plasma within the chamber. This led to some disbelief that it would be possible to have uniform plasma with workpieces having complex geometries or multiple workpieces arranged in parallel. Unexpectedly and surprisingly, the present invention was not only able to create hollow cathode effect within the chamber loaded with workpieces with simple or complex geometries in a non-concentric arrangement, but was also able to achieve uniform plasma by regulating the cathode power or voltage, pulse waveform, pressure within the chamber, and/or adjusting chamber load and by positioning the workpieces in a predetermined arrangement.

The deposition system of the present invention advantageously applies high-quality hard coatings to workpieces at enhanced speeds. The coatings achieved are harder and have greater resistance to corrosion and erosion. The coating combines dry lubrication with exceptional hardness (e.g., up to 2000 Vickers or more) and is additionally highly wear resistant. The coating is created using a carbon-based formula, such as those described in U.S. Pat. No. 8,343,593 of Boardman et. al, which is herein incorporated by reference in its entirety. Briefly, the carbon-based coating provides a natural graphitic lubricity and an extremely low coefficient of friction, rendering this coating well suited for applications that require a clean, dry, permanent lubrication, eliminating the need for oils or greases, which can accumulate dirt and cause fouling. More specifically, the coating is achieved using low surface energy, which reduces adhesion of any fouling and deposits, thereby simplifying and easing cleaning of components. In firearm coating applications, for example, the coating is effectively used on dozens of different parts. This unique coating can dramatically reduce the problems of scaling, galling, fretting and many other friction-related issues, thereby enhancing performance and lowering costs considerably. Additionally, in armaments, the components that are coated using the carbon-based formula have higher firing rates and fewer malfunctions.

In some embodiments, the deposition system of the present system provides coatings that are used in applications that are subject to sliding wear from the sliding motion of parts, such as in reciprocating pistons and pumps, for example. The coatings may be carbon-based coatings that are applied using different optimized process condition and that have exceptional hardness and toughness, and can be thinner, about 3-6 μm in thickness, and still be extremely effective. In other embodiments, for abrasive applications, the coating on the workpieces may be in excess of 20 microns, for example, in excess of 35 microns. Applications for the coatings can be found in oil and gas, automotive, aerospace and a broad spectrum of other industries. The coatings are able to serve very effectively even in challenging operating environments, both wet and dry, including oil and drilling mud.

In some aspects, the coatings achieved using the deposition system are unique in that they are comprised of multiple layers, which creates a more impervious barrier against corrosion and other attacks to the substrate. This layered construction also enables a coating's performance to be tailored to specific applications by adjusting the composition and thickness of individual layers. For example, a coating may be made more or less hydrophobic, or tough, or hard, or wear-resistant, or brittle; or it may be modified in any number of ways to enhance performance for a particular application.

During the deposition process, high-energy ionized gases may be used to dean the parts and create an optimized adhesive bond before the hard coating is deposited. Additionally, the coating process of the present invention eliminates the line-of-sight limitations that spray-type coatings have. Since all deposition occurs within the dense plasma, all part surface including interior, exterior and complex three-dimensional shapes (such as screw threads, hammers, bolts, etc) are coated with high uniformity, eliminating the need for post-processing. The end result is that the system delivers significantly faster, higher-quality coatings and more complete, conformal coverage.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCRIPTION OF THE DRAWINGS

The features and advantages of the present invention will become apparent from a consideration of the following detailed description presented in connection with the accompanying drawings in which.

DESCRIPTION OF PREFERRED EMBODIMENTS

Figure 1:
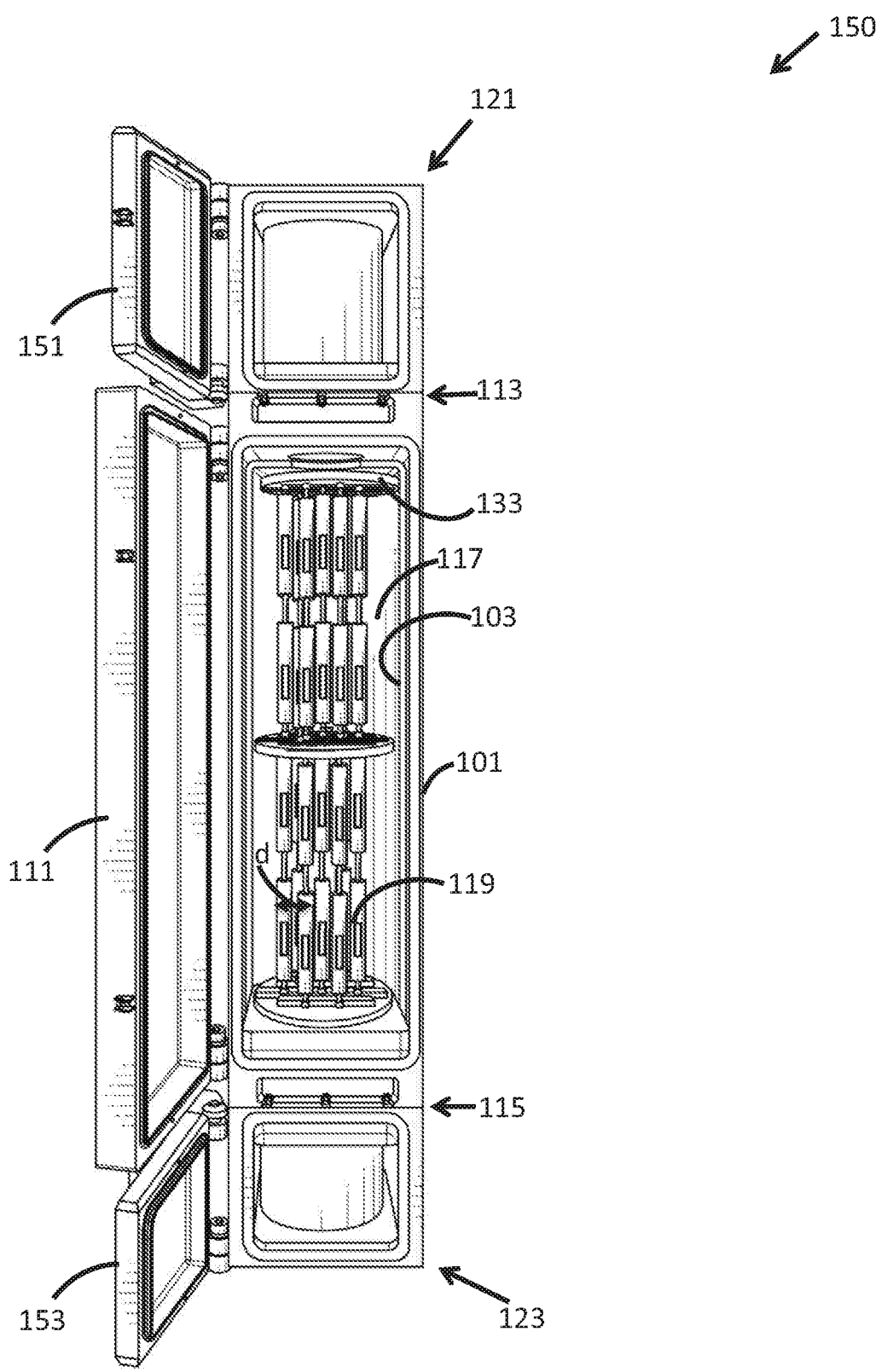
FIG. 1 shows an openable hollow chamber of a chemical vapor deposition system, according to one aspect of the present invention.
Figure 2:
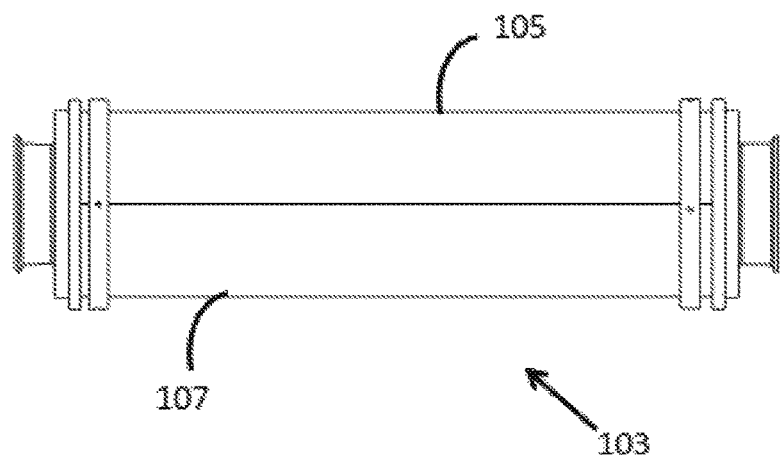
FIG. 2 shows a front view of an embodiment of modular, split tubular shielding to line the interior surface of a chamber.
Figure 3:
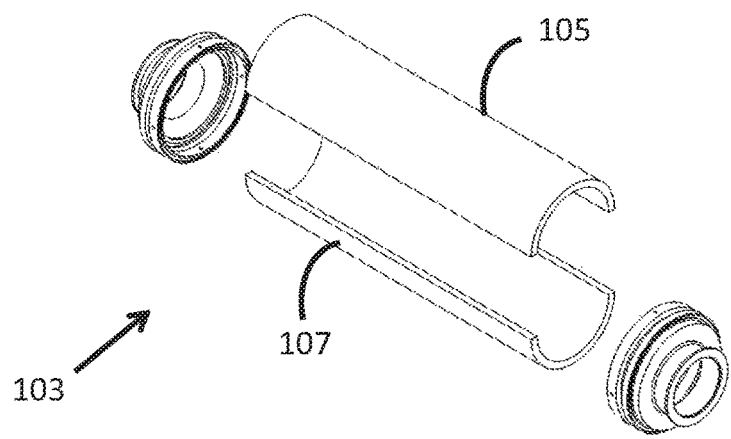
FIG. 3 shows an exploded view of the tubular shield having a first panel and a second panel that overlap and interlock to create a shield within the chamber.
Figure 4:
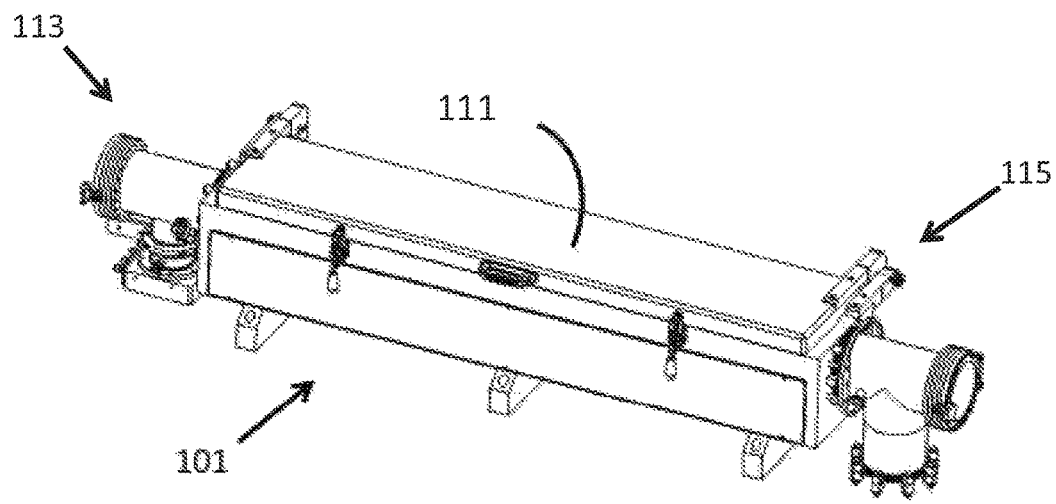
FIG. 4 shows the chamber having a moveable door for loading and unloading workpieces from the chamber.

Following is a list of elements corresponding to a particular element referred to herein:
- 101 chamber
- 103 modular chamber shield
- 105 first panel
- 107 second panel
- 109 movable chamber door
- 111 moveable chamber door
- 113 first end
- 115 second end
- 117 interior space
- 119 workpieces
- 121 gas feed anode chamber/head
- 123 vacuum side anode chamber/head
- 125 anodes
- 127 vacuum pump
- 128 pressure sensors
- 129 gas
- 131 DC power supply, which as used herein, includes pulsing or pulsed DC power supply
- 133 modular fixture
- 135 plurality of processing chambers
- 137 first chamber
- 139 second chamber
- 141 enclosure
- 143 gas manifold or line
- 150 deposition system
- 151 door
- 153 door
- 155 first valve
- 161 second valve
- 161 gas inlet
- 163 vacuum foreline (to pump)
- 1500 deposition system
- 1502 processing module
- 1504 gas module
- 1506 pressure module
- 1508 power module
- 1510 controller Referring now to FIG. 1-15, the present invention features a chemical vapor deposition system (150) for coating one or more workpieces (119) positioned within the system. The deposition system (150) may include a plurality of processing chambers (135), so that while one of the chambers is processing, an operator may unload or reload workpieces in the remaining chambers, thereby reducing downtime and increasing throughput of the system. Each processing chamber (101) of the plurality of processing chambers may be an openable hollow chamber having a first end (113) and an opposing second end (115). Herein, the first end (113) and the second end (115) enclose an interior space (117) within the chamber (101), and one or more workpieces (119) which require coating, are positioned in the interior space (117) of the chamber (101). A gas feed anode chamber/head (121) may be coupled to the first end (113) of the chamber (101). The gas feed anode chamber/head (121) may be configured to direct gas into the chamber (101) for coating the workpieces (119). Additionally, a vacuum side anode chamber/head (123) may be coupled to the second end (115) of the chamber (101), wherein the vacuum side anode chamber/head (123) is configured to apply a vacuum to the interior space of the chamber (101) while operating the chamber to coat the workpieces, as discussed further below. The gas feed anode chamber/head (121) may be interchangeably referred to as gas head (121) and the vacuum side anode chamber/head (123) may be interchangeably referred to as vacuum head (123).

In one embodiment, the first end may be a top side of the chamber and the second end may a bottom side of the chamber, and the gas head (121) may be coupled to the top side and the vacuum head may be coupled to the bottom side. In another embodiment, the first end may be a bottom side of the chamber and the second end may a top side of the chamber, and the gas head (121) may be coupled to the bottom side and the vacuum head may be coupled to the top side.

The chamber (101) includes a moveable door (111) for accessing the interior space (117) of the chamber. Herein, the operator may open the door (111) to load workpieces into the chamber for coating. Once the workpieces are loaded into the chamber (101), the operator may shut the door (111) before starting the coating process, for example. In addition, the operator may open the door (11) to unload the workpieces from the chamber after the coating process is complete. In some embodiments, the gas chamber (121) and the vacuum head (123) may each include separate doors (151, 153, respectively) that allow access to the inside of the gas chamber and vacuum head respectively, for inspection and troubleshooting, for example. In some embodiments, the moveable door (111) may be moved or removed. The door may be pivotably connected to the chamber (101). The door (111) may be closed to form a hermetic seal of the chamber (101).

In current deposition systems, the chamber walls or interior surface of the chamber gets coated and requires periodic cleaning, which may result in a downtime of the deposition system. In order to avoid downtime in deposition systems, the present invention includes a lightweight modular chamber shield (103) that lines the interior surface of the chamber. The shield (103) is in face-sharing contact with the interior surface of the chamber (101) and blocks the film coating from getting on the walls or interior surface of the chamber (101). Thus, the shield (103) protects the interior surface from getting coated.

In some embodiments, the shield (103) may include a first half or panel (105) overlapping and interlocking a second half or panel (107). After coating, the shield (103) may be easily removed from the chamber (101), via the moveable door (111) disposed on the front of the exterior chamber (101) and partitioned or disassembled into the first panel (105) and the second panel (107) for ease of cleaning or inspection. The disassembled panels may be cleaned offline, with no impact on throughput, and the freshly cleaned panels may be mounted together and subsequently reused.

In some embodiments, the shield (103) may include two panels where each panel is roughly half cylindrical in shape. In other embodiments, the shield (103) may include four panels, where each panel may include a roughly half-cylindrical shape. The shield (103) may include more than four panels, and may include other shapes, such as arc, dome, etc, without deviating from the scope of the invention. The panels of the shield (103) may be sized to fit in the interior space of the chamber. More specifically, outer surfaces of the panels may be in face-sharing contact (or touching) the inner walls or surfaces of the chamber, thus forming a protective covering on the chamber walls. In other embodiments, the interior surface of the chamber or chamber walls may be covered with a foil that may be disposed or recycled after a deposition run.

In supplementary embodiments, the interior surface of the exterior chamber (101) may comprise a circular cross section, where a longitudinal axis of the exterior chamber (101) may extend perpendicular to the circular cross section. Additionally, the shield (103) may be centered along the longitudinal axis. In further embodiments, the geometry of the interior surface of the exterior chamber (101) is complementary, with respect to the longitudinal axis, to the geometry of the exterior surface of the shield (103). As a non-limiting example, some embodiments feature the exterior surface of the shield (103) defining a cylindrical shape coaxial with the interior surface of the chamber (101).

Figure 5:
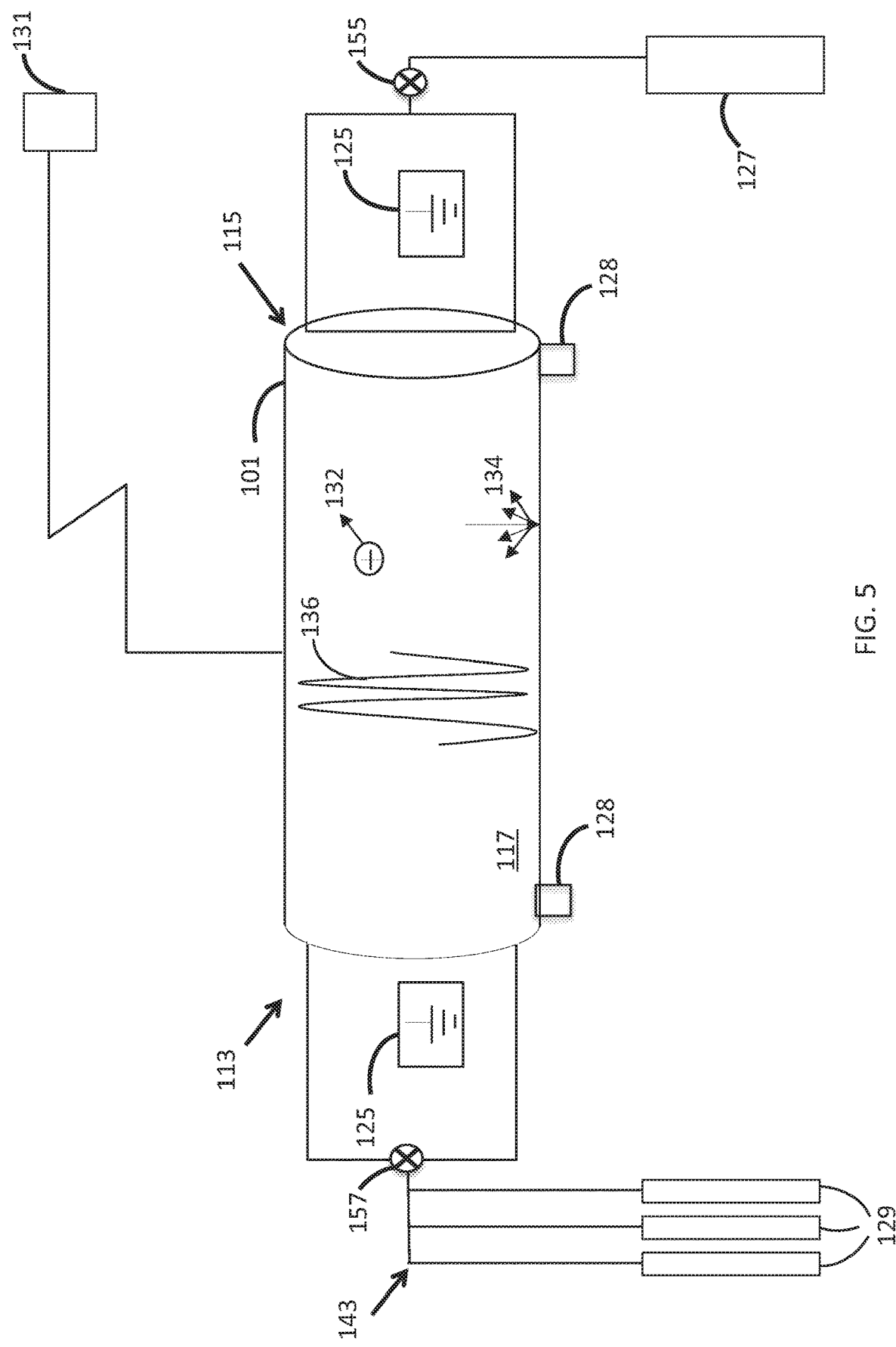
FIG. 5 shows a schematic diagram of cathodes and anodes of the system enabling a hollow cathode condition within an interior space of the chamber.

The deposition system (150) is an advanced deposition system that applies high-quality hard coatings to electrically conductive substrates inside and out in a fast and efficient manner. The system (150) achieves uniform coating on surfaces by maintaining a hollow cathode condition within the interior space (117) of the chamber (101), as shown in FIG. 5. The hollow cathode condition occurs when at least two cathode surfaces are positioned opposite to each other and are electrically cooperative with spaced apart anodes, such that an "oscillation motion" of electrons is achieved to increase ionization rates within a plasma.

Turning now to FIG. 5, the chamber (101) of the deposition system (150) includes one or more anodes (125) positioned on the first and second ends (113, 115) of the chamber (101). A gas supply (129) is connected to the chamber via a gas line (143) to provide a flow of one or more of reactant gas, an adhesion gas, and a cleaning gas to the chamber (101). The gas line (143) may be coupled to the first end of the chamber (101). The type of gas supplied to the chamber (101) may depend on the state of operation of the chamber (101). As an example, the reactive gas may be supplied to the chamber for coating the workpiece surfaces. As another example, cleaning gas may be supplied to clean the inside of the chamber and/or clean workpiece surfaces prior to actual deposition of coating. As yet another example, prior to coating the workpieces, the adhesion gas may be supplied to the chamber to enhance adhesion of the coating to the surfaces. In some embodiments, during the coating process, high-energy ionized gases may also be used to clean the parts and create an optimized adhesive bond before the hard coating is deposited. Some non-limiting examples of the types of gas supplied to the chamber include silane, nitrogen, argon, helium, hydrogen, methane, acetylene, and the like.

When applying coating to surfaces of the workpieces, the reactive gas is supplied to the chamber via a valve (157). The reactive gas is used to generate a plasma in the interior space (117) of the chamber (101). The system (150) includes a pulsed DC power supply (131) operatively coupled to the chamber (101). The DC power supply (131) is configured to apply a large negative bias to the workpieces (119) and the chamber (101). In some embodiments, the DC power supply may be a pulsed DC supply. Hence, the workpieces and the chamber function as cathodes. In some embodiments, the negative bias is additionally applied to the shield (103). Herein, the shield is conductive and thus biased and part of the hollow cathode system. The system (150) additionally includes anodes (125) positioned on the opposite ends of the chamber (101). In some embodiments, the anodes (125) may be gas purged electrodes, as disclosed by Boardman et. al in U.S. Pat. Pub. No. 2007/0262059 A1 (herein incorporated by reference in its entirety), and positioned on the first end (113) and second end (115) of the chamber (101). In some embodiments, the anode may include a metal coil that creates a magnetic confinement field. As such, the DC power supply (131) may apply a negative bias to the workpieces (119) and the chamber (101) thereby generating a hollow cathode condition within the chamber (101).

Without wishing to limit the invention to a mechanism, the bias applied to the workpieces (119) and the chamber (101) via the DC power supply (131) creates a plasma within the interior space (117) of the chamber (101), which results in high-energy electrons oscillating (136) between the sides of the chamber (the cathode) and further causes a high level of ionization (132) of the gas and results in a very dense plasma formed within the interior space (117). This effect is what is known classically as a hollow cathode discharge. This plasma is characterized by a very low impedance, allowing a high effective current flow at relatively modest power levels. The low plasma impedance is also characterized by a low voltage on the electrodes.

Thus, the hollow cathode region created within the interior space (117) of the chamber (101) generates the field of high-energy electrons oscillating (136 in FIG. 5) between the sides of the chamber (the cathode), with the two ends of the chamber serving as anodes. The hollow cathode region bathes the workpieces positioned in the interior space (117) in an ultra-high intensity plasma (e.g., over 200 times greater than a standard plasma), that effectively and conformally covers all workpiece geometries, both exterior and interior, and further allows the workpieces to be coated at an unprecedented high deposition rate. Compared to currently available systems which have deposition rates of microns per hour (e.g., 1-2 µm/hour), the deposition system of the present invention can achieve deposition rates of upwards of microns per minute (e.g., 0.25-1+ µm). In some embodiments, the power supply (131) may be additionally configured to apply a reverse pulse to the cathodes to discharge the coatings that are deposited on the surfaces.

Figure 7:
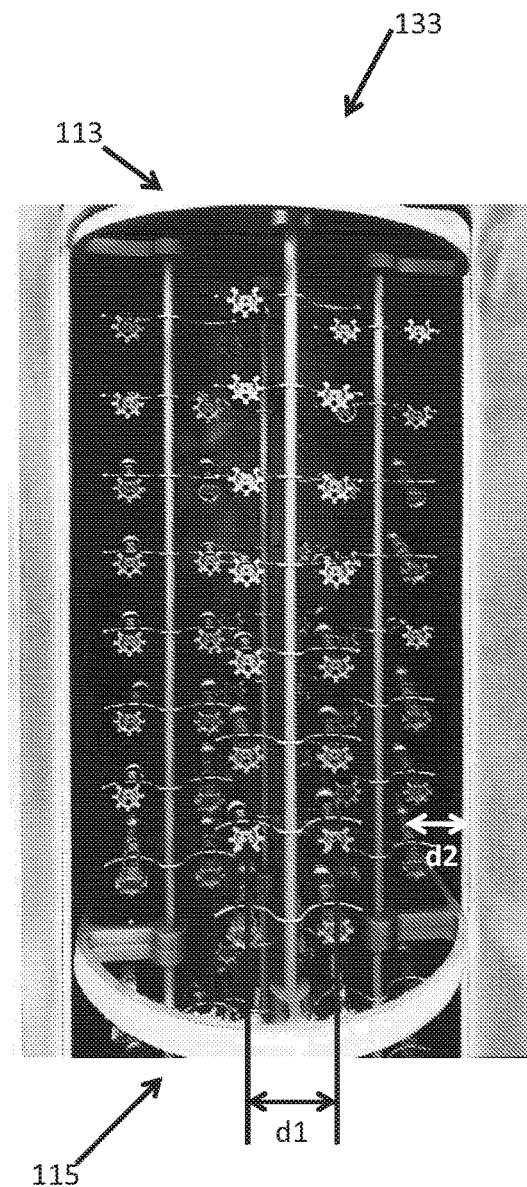
FIG. 7 shows a non-limiting example design of the fixture.

To coat workpieces having complex 3D shapes and geometries, the deposition system (150) includes a fixture or rack (133) configured to mount the workpieces within the interior space (117) of the chamber (101). Herein, the fixture (133) is modular and is custom-designed based on the shape and geometry of the workpieces. Some non-limiting examples of workpieces having complex geometries include various parts of handguns, shotguns, and rifles, such as hammers, trigger assemblies, bolts, bolt carriers, slides, levers, magazines, and the like. A non-limiting example of the fixture (133) is shown in FIG. 7. Herein, the fixture (133) is configured to maintain the workpieces in a predetermined arrangement which allows for the hollow cathode effect to be maintained in the interior space (117) of the chamber (101). As such, the predetermined arrangement includes a first spacing d1 between individual workpieces and further includes a second spacing d2 between the workpieces and the shield (103). Herein, the first spacing d1 may be a threshold spacing selected from either a minimum dimension of the individual components of the workpieces or a fixed separation value, whichever is lower. In some embodiments, the minimum dimension may be a width, height, or a length of the workpiece. In some embodiments, the first spacing and the second spacing may be further adjusted to increase a packing density of the chamber (101) thereby maximize the workpieces that are coated during a coating run of the deposition chamber. As an example, the fixed separation value may be about ½" to about 3". The fixed separation value may be range from about ½" to 1", or about 1" to 1½", or about 1½" to 2", or about 2" to about 3". The present invention is not limited to the aforementioned separation distances. One of ordinary skill in the art would be able to determine the ideal separation distance of the workpieces.

Figure 6:
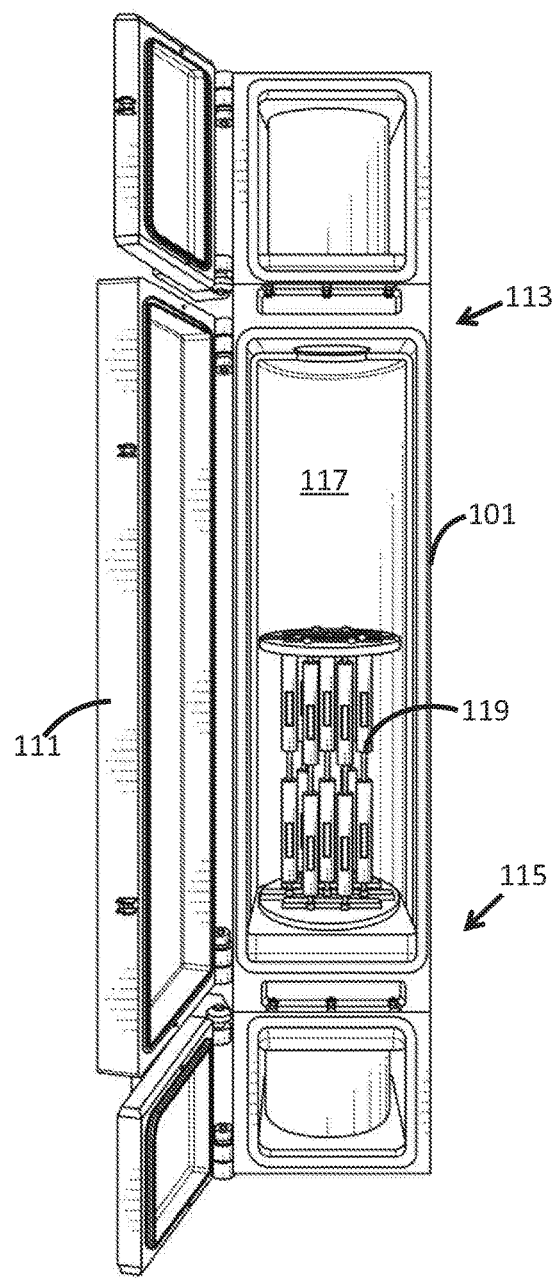
FIG. 6 shows the chamber having a modular fixture for positioning workpieces within the chamber.
Figure 8:
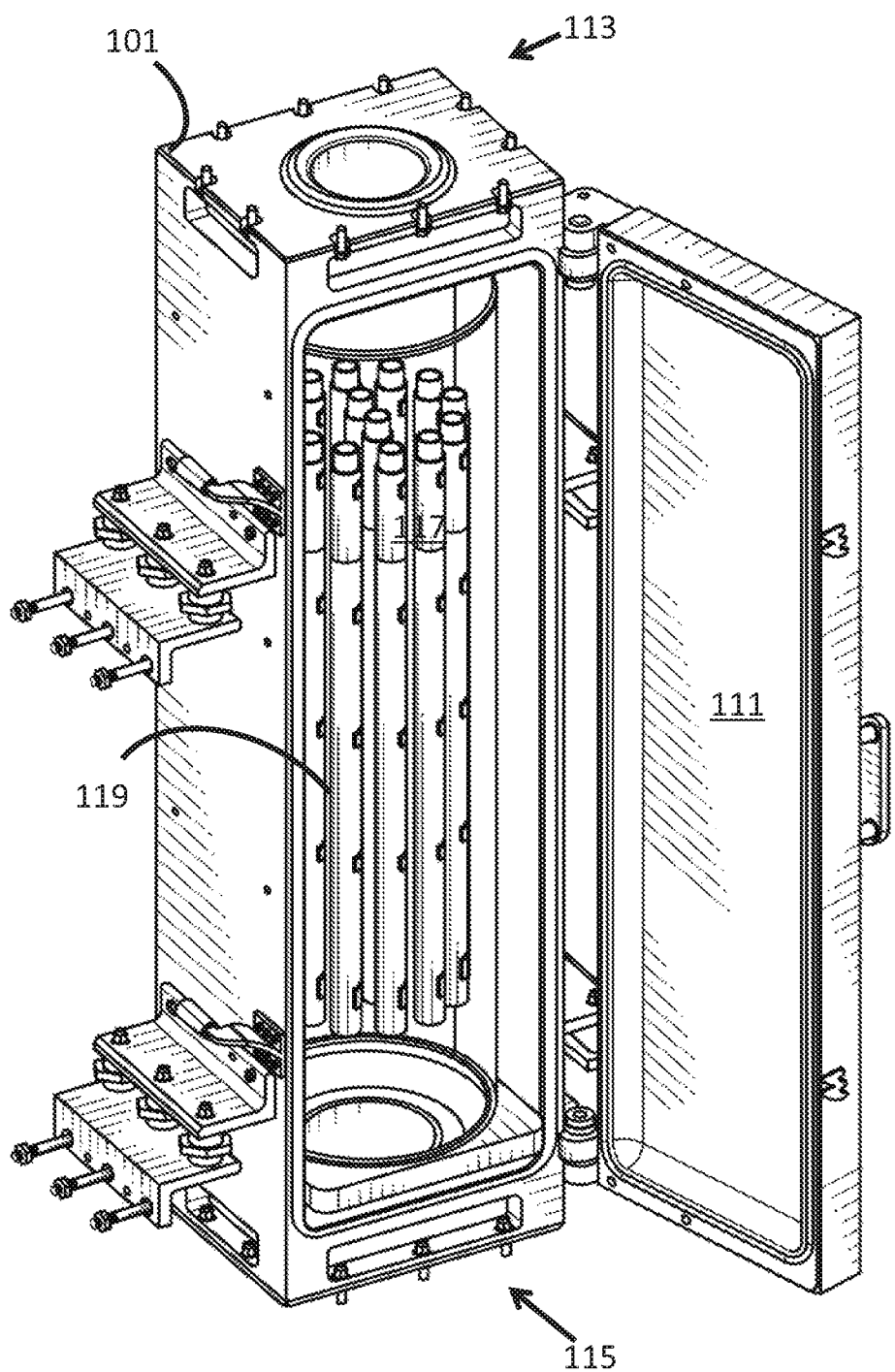
FIG. 8 shows workpieces aligned along a longitudinal axis of the chamber.
Figure 9:
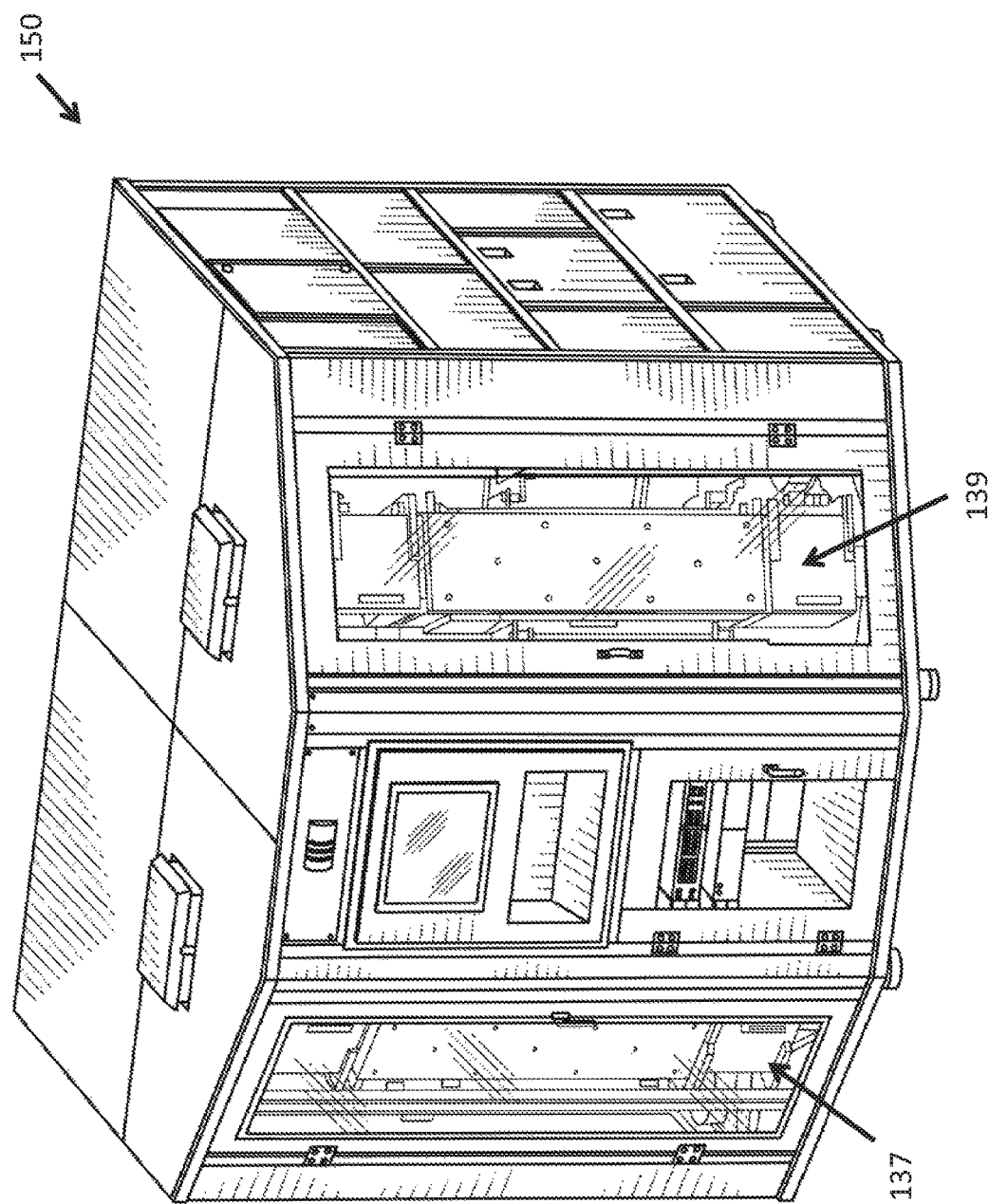
FIG. 9 shows a non-limiting example of the deposition system having multiple chambers for coating different sets of workpieces positioned within the chambers.

A length of the fixture (133) may depend on a length of the workpiece, for example. In some embodiments, the length of the fixture (133) may be smaller than a length of the chamber (101), as shown in FIG. 6. In such embodiments, the fixture (133) may be coupled to one end of the chamber, and may not be coupled to the opposite end. In FIG. 7, the fixture (133) is coupled to the second end (115) and is not coupled to the first end (113). In other embodiments, the fixture (133) may be coupled to the first end (113) and not to the second end (115). In some embodiments, the fixtures (133) may be stacked on top of another fixture to cover the entire length of the chamber (101). In some embodiments, the fixture (133) may extend across the entire length of the chamber (101) to mount long workpieces (119), as shown in FIG. 8. In such embodiments, the fixture (133) may be coupled to both the first end (113) and the second end (115) of the chamber (101), thus spanning the entire length of the chamber.

In some embodiments, the workpieces may be arranged in a parallel configuration within the interior space of the chamber. A parallel configuration refers to the workpieces being arranged such that they lie on the same plane, where said plane intersects the chamber to form a cross-section that is perpendicular to the sidewalls of the chamber. In some embodiments, the workpieces may be arranged in a plurality of rows and a plurality of columns.

There are some advantages of the fixtures (133) of the present invention. For example, currently available deposition systems typically require the operator to load and unload parts using large carousels that are heavy and unwieldy. However, the fixtures (133) of the present invention are light weight, easy to handle, and custom designed, thereby allowing the operator to not only rack and unrack workpieces onto the fixture easily, but also allows for loading and unloading the workpieces from the chamber in a more efficient manner, for example.

Returning to FIG. 5, a vacuum pump (127) may be coupled to the second end (115) of the chamber (101) and used to adjust the pressure inside the chamber (101) via a valve (155). In some embodiments, additional turbo pumps may be coupled to the chamber (101). Herein, the pressure inside the chamber may be adjusted based on one or more of the first spacing d1 between the individual parts of the workpieces, and the second spacing d2 between the workpieces and the interior surface of the chamber, so that the hollow condition is maintained in the chamber. As an example, for larger spacings, lower pressure may be applied; while for smaller spacing, higher pressure may be applied to the chamber. The pressure setting may be adjusted such that the pressure within the chamber establishes a condition in which the electron mean free path is related to the spacing between the individual workpieces. In some embodiments, pressure sensors (128) may be located at each attachment head so that the pressure in the pipe can be monitored and controlled. Since the electron mean free path increases as the pressure decreases, the pressure applied to the chamber may be decreased as the spacing d1 and/or d2 increases. As an example, for a spacing of about 1", a pressure between 100-300 mTorr may be applied to the chamber. As another example, for a spacing of about 4", a pressure between 55-120 mTorr may be applied. The above mentioned values are for example purposes only and are not meant to be limiting in the present invention. In this way, by adjusting the pressure within the chamber, the hollow cathode condition may be maintained within the chamber, which allows for workpieces with complex geometries and varied spacing to be coated by the deposition system (150) of the present invention. It may be appreciated that the coating process achieved using the deposition system (150) eliminates line-of-sight limitations that spray-type coatings have. Since all deposition occurs within the dense plasma, all part surfaces, including interior, exterior and complex 3D shapes are coated with high uniformity, thereby eliminating the need for post-processing. In this way, the deposition system (150) achieves significantly faster, higher-quality deposition and more complete, conformal coverage.

The deposition system (150) of the present invention is designed for fast, streamlined, and high-efficiency deposition applications. To maximize throughput, the deposition system (150) may include a plurality of processing chambers (135), wherein each chamber is independently processed. The plurality of chambers may be operated in parallel or sequential configuration. In other embodiments of the plurality of chambers, some of the chambers of the plurality of chambers may be operated in parallel while others are being loaded so that a sequence of parallel operations occurs in the deposition system.

Turning now to FIGS. 9-12, the deposition system (150) having the plurality of chambers (135) is shown. In a non-limiting example, the plurality of chambers includes two chambers, a first or left chamber (137) and a second or right chamber (139). Each of the first chamber and the second chamber may be non-limiting examples of the chamber (101) described previously. Briefly, each of the first chamber and the second chamber includes the movable door (111), and the workpieces may be loaded and unloaded via the moveable door (111). Additionally, the workpieces may be mounted into the first and the second chamber using modular fixtures (133) that are designed based on the complex shape and geometry of the workpieces, as described previously. The first and the second chamber may be operatively coupled to the gas chamber (121) and the vacuum head (123).

In some embodiments, the first and the second chambers may be operated in parallel, independent of one another. As an example, while the first chamber (137) is processing and coating a first set of workpieces positioned within the first chamber (137), the second chamber (139) may also be coating a second set of workpieces positioned within the second chamber (139), thereby streamlining the system. As an example, when there is excess pumping or power available in the system, one or more chambers may be operated in parallel to increase throughput of the system. In some embodiments, the first and the second chambers may be operated in a sequential manner. As an example, while the first chamber (137) is processing and coating the first set of workpieces positioned within the first chamber (137), the second chamber (139) may be open for loading or unloading the second set of workpieces or performing maintenance on the second chamber (139), thereby maximizing throughput of the system.

Figure 10:
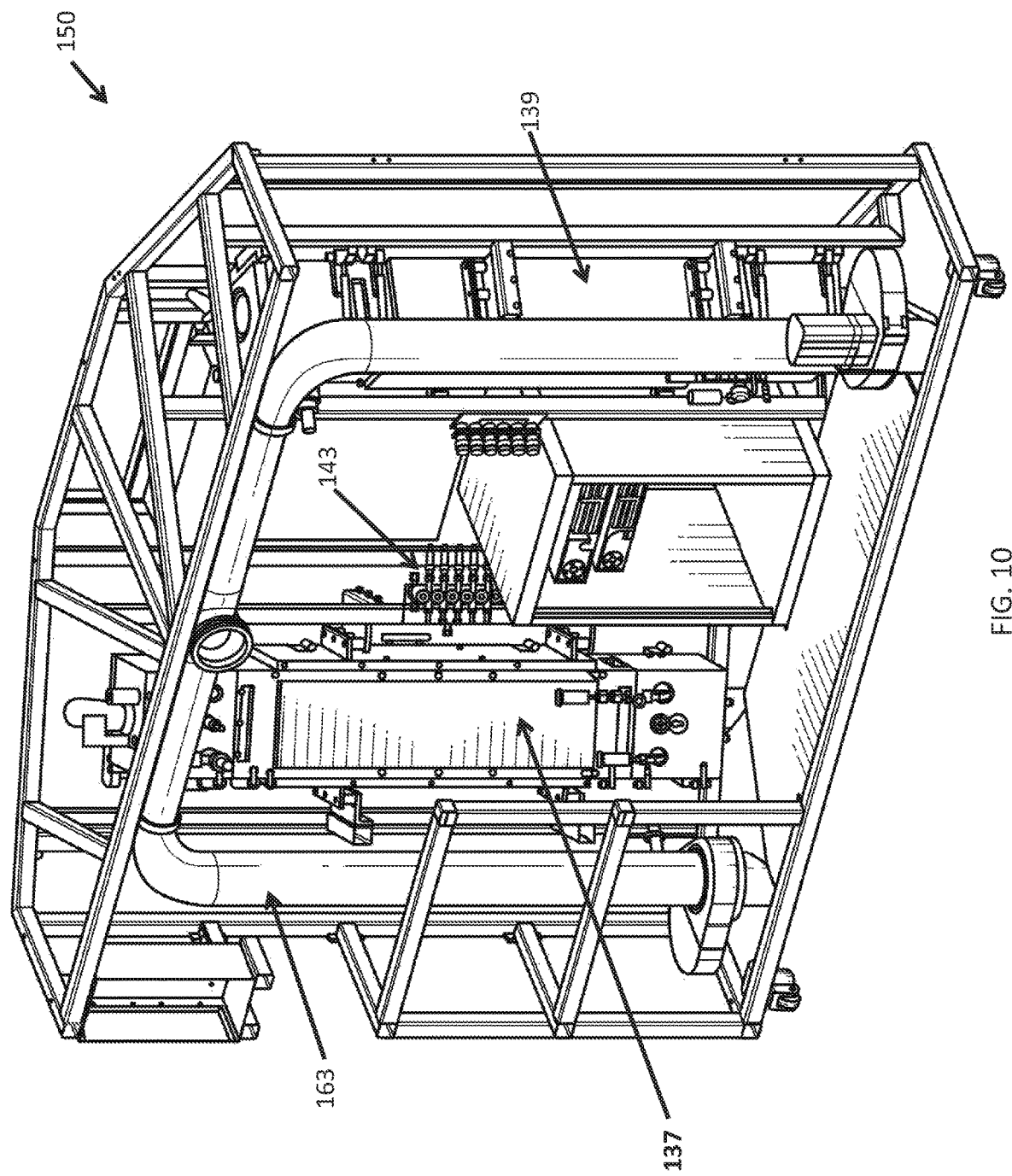
FIG. 10 shows gas manifolds of the deposition system that deliver one or more of a reactive gas, an adhesion gas, and a cleaning gas to the each chamber based on an operating condition of the chamber.
Figure 11:
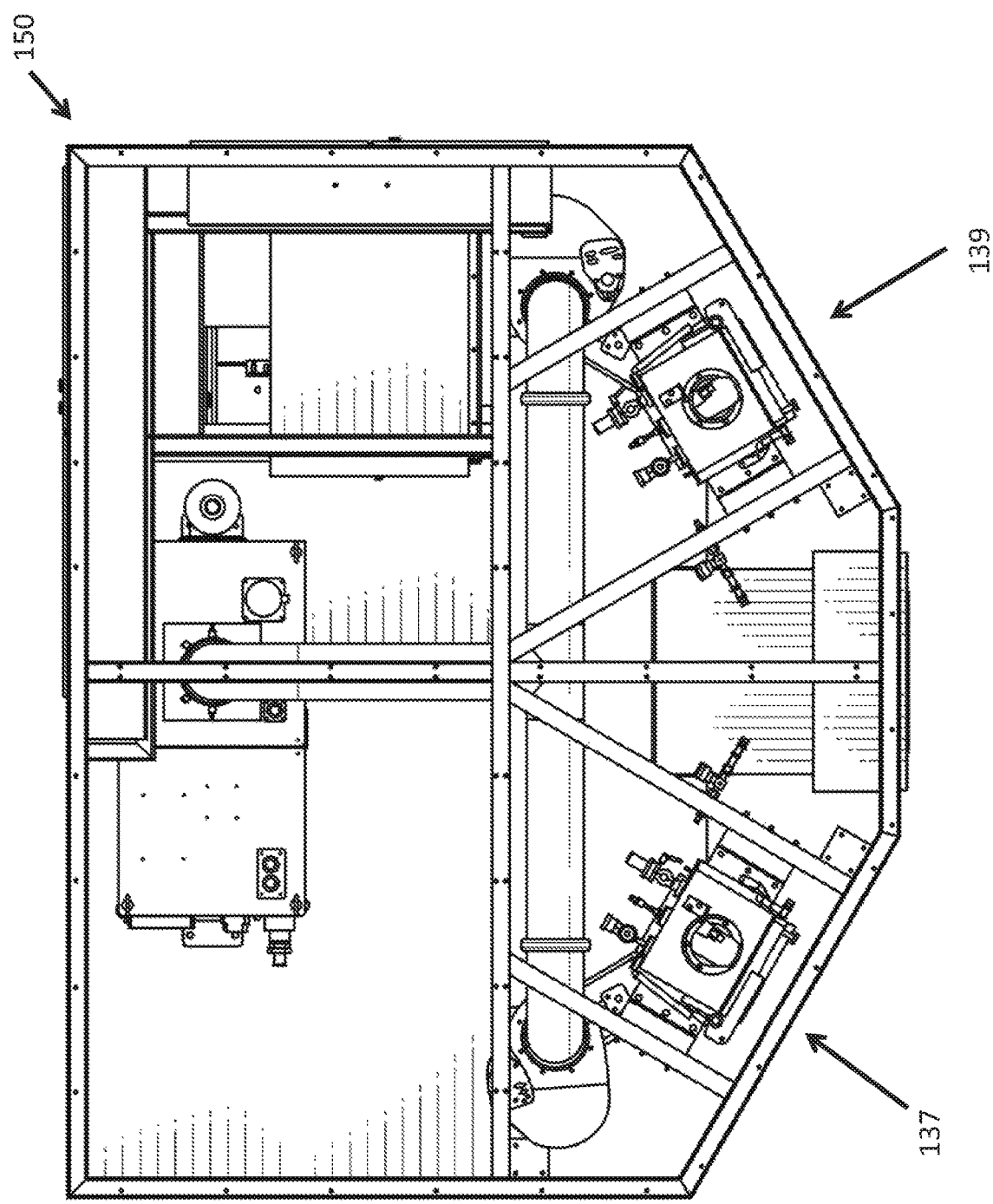
FIG. 11 shows a top view of the deposition system.
Figure 12:
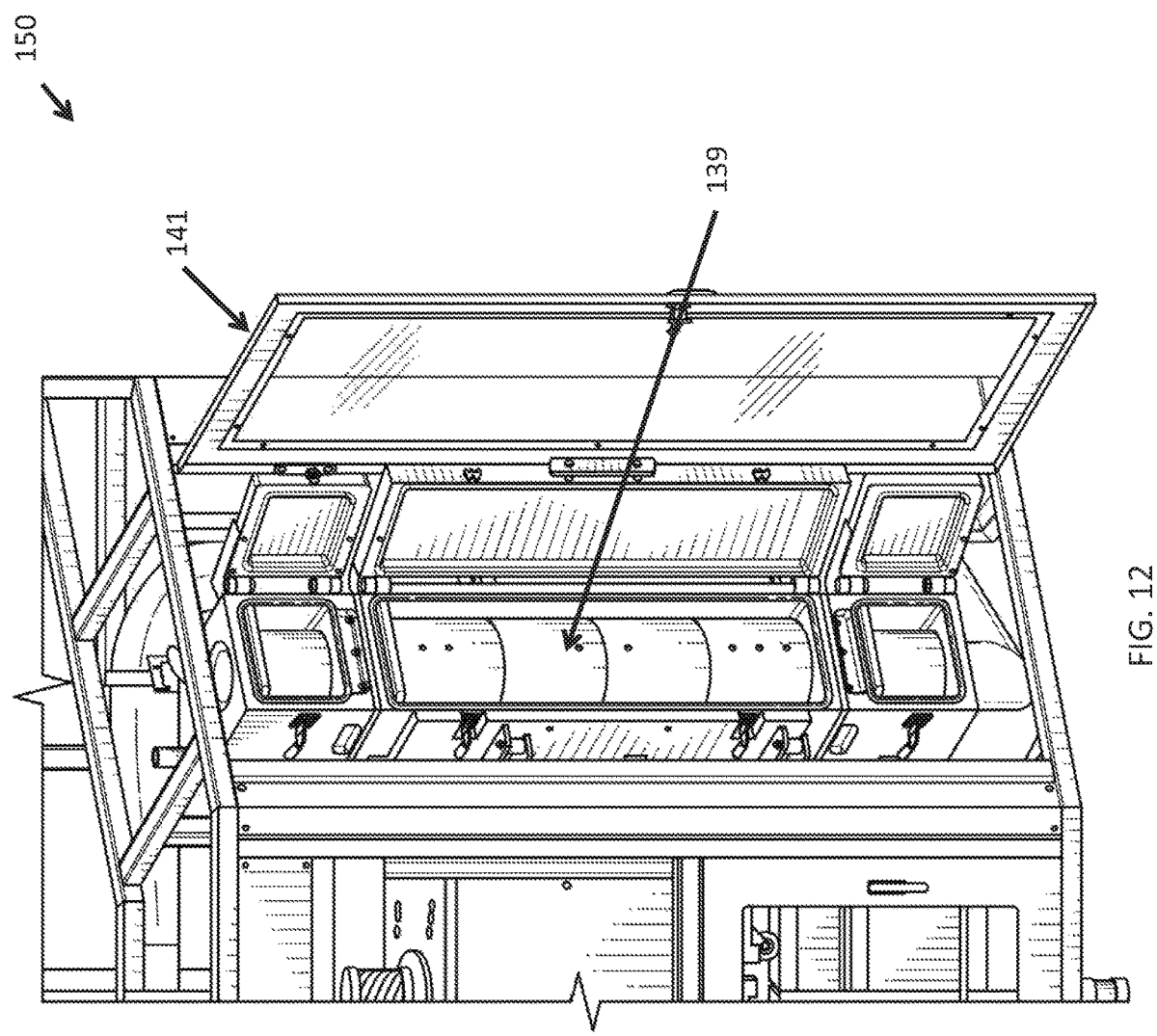
FIG. 12 shows one chamber of the deposition system with the moveable door ajar for loading and unloading workpieces.
Figure 13:
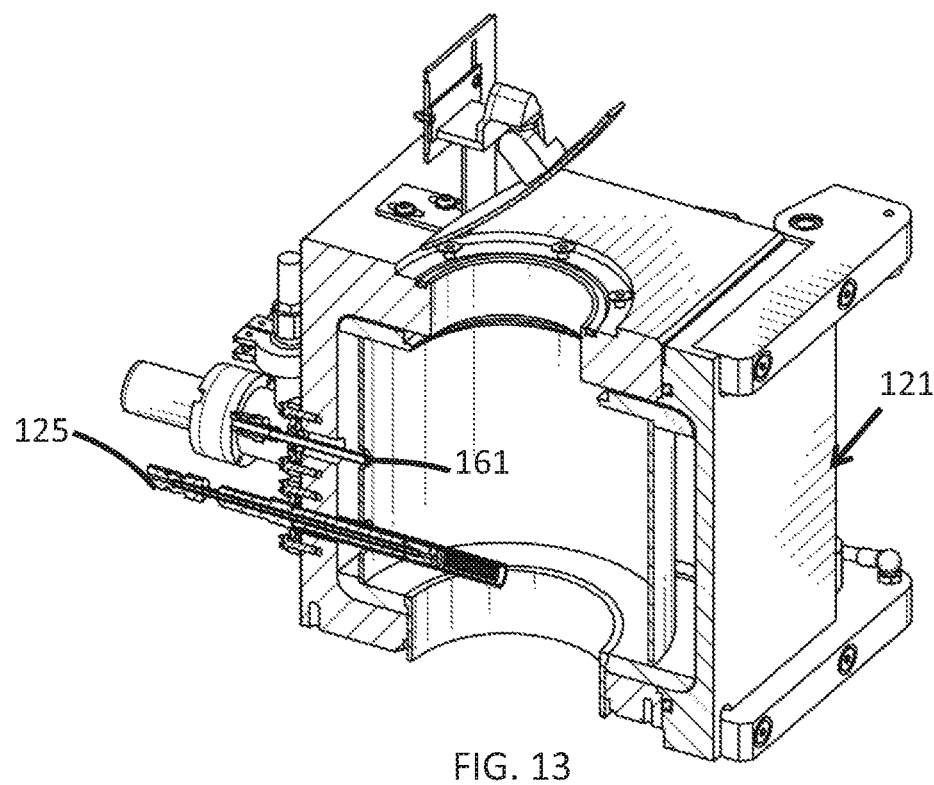
FIG. 13 show a gas chamber coupled to a first end of the chamber configured to deliver gas to the multiple chambers of the system.
Figure 14:
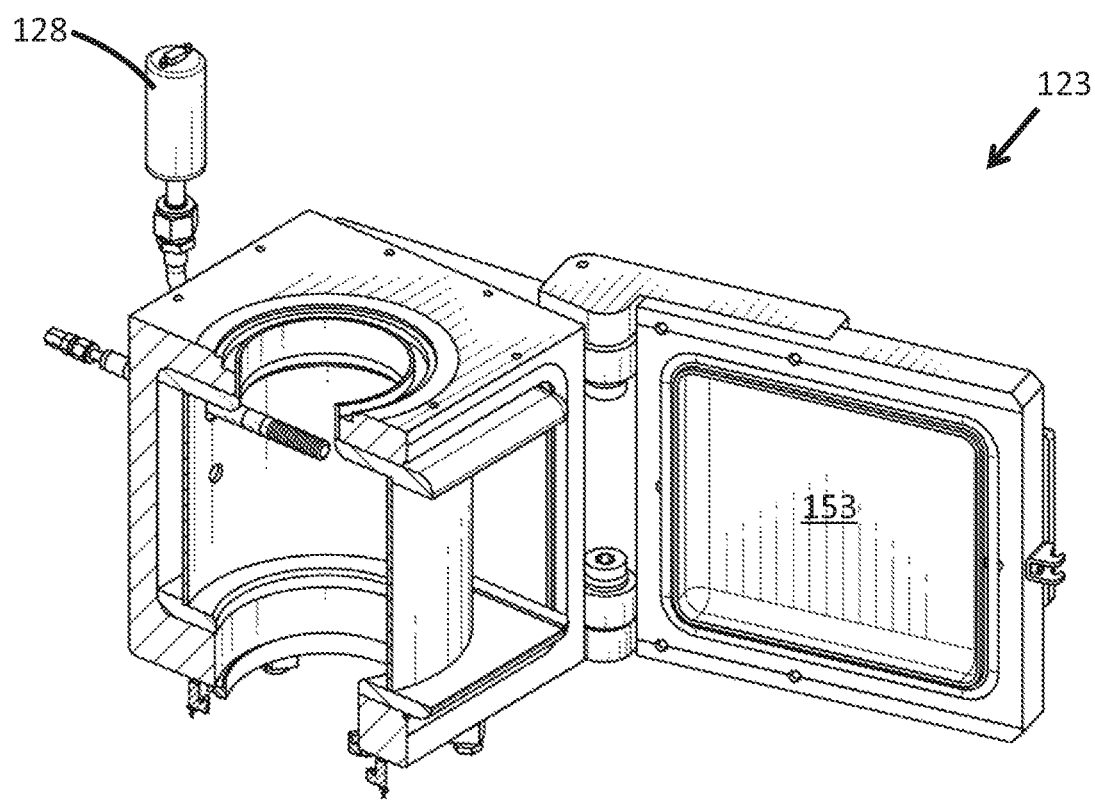
FIG. 14 shoes a vacuum head couple to an opposing second end of the chamber.

Gas may be directed to the first and the second chambers via gas manifolds shown in FIG. 10. Herein, the gas manifold or gas line (143) delivers one or more of the reactive gas, the adhesion gas, and the cleaning gas to each of the first chamber (137) and the second chamber (139). One or more valves (163) may be coupled to the manifold (143) for selectively directing the gas flow into the first and the second chamber. In an example situation where the first chamber is being used for coating the first set of workpieces, and the second chamber is being used for unloading the second set of workpieces, the one or more valves (163) may be operated to selectively deliver the reactive gas only to the first chamber and not to the second chamber. Herein, gas may be delivered into the chamber via a gas inlet (161) shown in FIG. 13.

In some embodiments, the deposition chambers may be vertically oriented and about 40 inches by 10 inches in diameter. However, the deposition chambers may be designed and oriented based on custom chamber configuration needs of a specific user.

Figure 15:
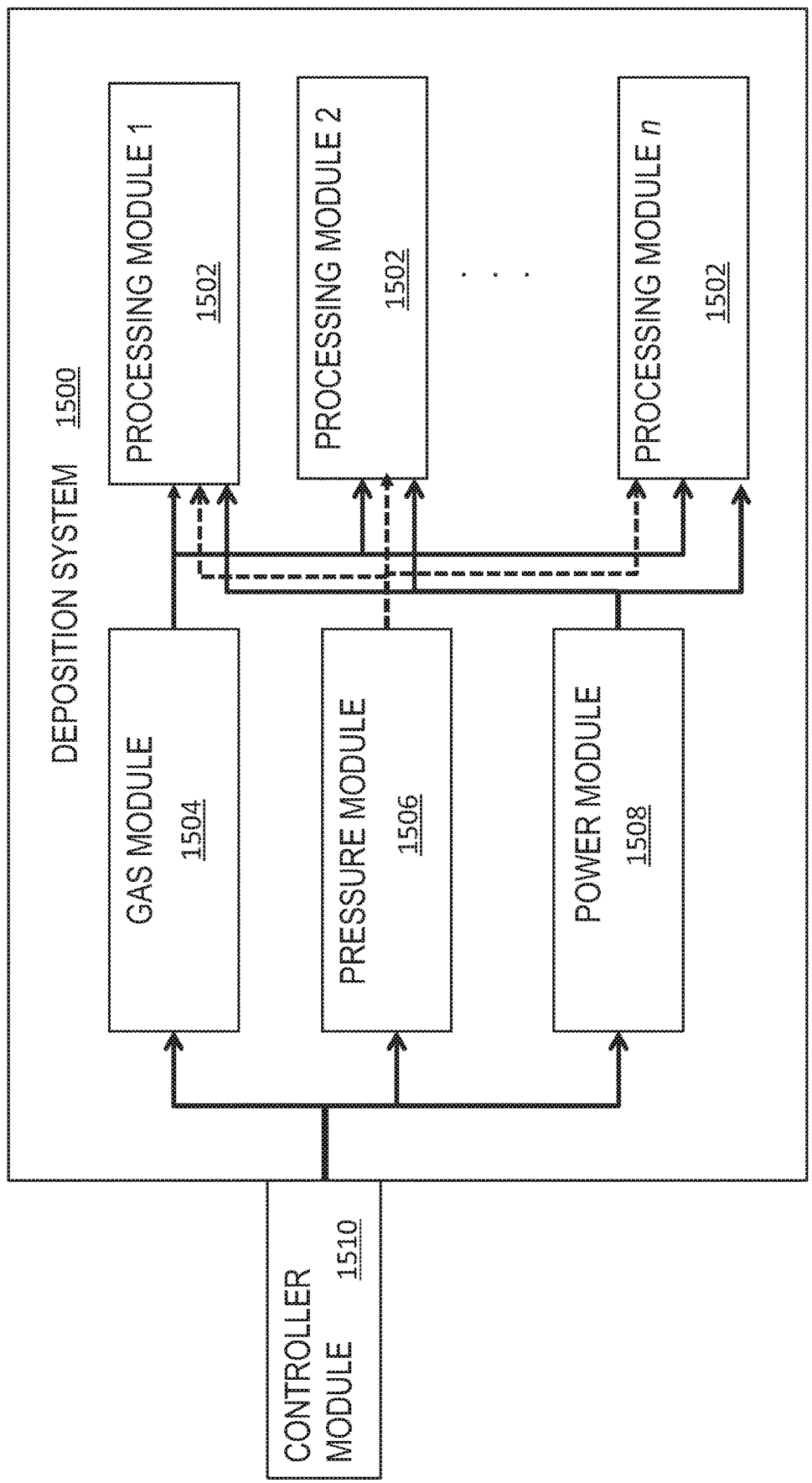
FIG. 15 shows a schematic diagram of the deposition system having a gas module, a pressure module, and a power module coupled to one or more processing modules of the deposition system, and further comprising a controller module for controlling each of the aforementioned modules to ensure uniform coating of complex surfaces of the workpieces.

Turning now to FIG. 15, a schematic diagram of a deposition system (1500) for applying coatings to workpieces is shown. The deposition system (1500) may be a non-limiting example of the deposition system (150) described previously. The deposition system (1500) may include one or more processing modules (1, 2, . . . n) wherein each processing module may include a chamber (101), wherein the chamber includes a movable door (111). Herein, each processing module is configured to operate individually such that the chamber of one processing module is independent of the chamber of another processing module, wherein while processing module is processing and coating a first set of workpieces positioned within the chamber (101), the other processing module is available for loading or unloading a second set of workpieces or for receiving maintenance, thereby increasing throughput of the deposition system.

In some embodiments, deposition system may include a plurality of processing modules. For example, the number of processing modules may range from about 2-10. However, the present invention is not limited to a fixed number of processing modules and can include any number of processing modules as desired.

Each processing module further includes the modular fixture (133), and the modular fixture is custom-designed based on the complex geometries of the workpieces. The modular fixtures allow workpieces of different geometries to be loaded in the chamber. Each processing module may additionally include the modular lining shield (103), wherein the shield is fitted within the interior space of the chamber, wherein the shield includes the first panel (105) and the second panel (107) that overlap and interlock to create a shield within the chamber. Herein, the shields are quick-change shields that minimize chamber cleaning downtime, for example.

The deposition system (1500) may include a gas module (1504) operatively coupled to each of the processing modules (1502). Herein, the gas module (1504) may include one or more of the cleaning gas, the adhesion gas, and the reactive gas. The gas module (1504) may include a first valve (such as valve (157) of FIG. 5), wherein the first valve is configured to divert one or more the cleaning gas, the adhesion gas, and the coating gas only to the chamber being used for coating workpieces. As an example, if multiple chambers in the plurality of processing modules are used for coating workpieces, the first valve may be adjusted such that the reactive gas is supplied to all of the multiple chambers to coat the workpieces, but not to the remaining chambers that are not used for coating. As another example, the first valve may be adaptively adjusted to supply the correct type of gas to the chambers based on the operation that is being performed. For example, if a first set of chambers of the processing modules are at the cleaning stage, a second set of chambers are at adhesion stage, and a third set of chambers are at coating stage, the valve may be accordingly adjusted to supply cleaning gas to the first set of chambers, adhesion gas to the second set of chambers, and reactive gas to the third set of chambers. In this way, the gas module may adaptively adjust the gas supply to the processing chambers based on the operation that is being performed. As a result, the process flow in the deposition system (1500) is unaffected, and different set of workpieces may be coated simultaneously in a streamline fashion.

The deposition system (1500) additionally includes a pressure module (1506) operatively coupled to the plurality of processing chambers. Herein, the pressure module includes a vacuum pump (such as the vacuum pump (127) of FIG. 5). Herein, the vacuum pump (127) may be operably coupled to each chambers of the processing module via a second valve and the second valve may be configured to apply a vacuum, via the vacuum pump, only to chamber being used for coating workpieces. As an example, if some of the chambers are being used for coating workpieces, while the remaining chambers are under maintenance, the second valve may selectively apply vacuum to only the chambers that are used for coating, and not to the remaining chambers that are under maintenance. In some embodiments, the second valve may be a valve system comprising one more valves, for instance, about 1 to 4 valves. The valves may be a roughing bypass valve, an isolation pressure control valve, a pendulum isolation valve, or any combination thereof. For example, the vacuum pump may be operably coupled to each of the processing modules via a roughing bypass valve and an isolation pressure control valve connected in series. In some embodiments, a common foreline may be coupled to each chamber of the processing module. In addition, each chamber may include a roughing/bypass valve and a isolation/pressure control valve. The isolation/pressure control valve may be a combo valve which replaces separate isolation and control valves. In other embodiments, the valves may include pendulum isolation valves which have dual action. In some embodiments, the pressure applied to the chambers may be adjusted based on the spacing of components positioned within the chamber so that the hollow cathode condition is maintained within the chambers. As an example, the pressure module may apply a higher pressure to a chamber that has closely spaced workpieces and further apply a lower pressure to a chamber that has widely spaced workpieces. In this way, the pressure module may be configured to adjust the pressure applied to maintain hollow cathode condition in each of the processing chambers.

The deposition system (1500) additionally a power module (1508) includes anodes (such as anodes (125) of FIG. 5) operably coupled to the one or more processing modules. The power module further includes a DC power supply (such as the DC power supply (131) of FIG. 5) operably coupled to each chamber of the processing modules. The power module (1508) may be configured to apply bias to only chamber being used for coating and workpieces that are being coated as cathodes, for example. Additionally, the power module may adjust a voltage applied to the anodes and the cathodes to maintain hollow cathode condition within an interior space (117) of each chamber. In some embodiments, the power module (1508) may adjust the voltage applied based on the spacing between individual workpieces in the chamber. As an example, different types of workpieces may be mounted in different chambers of the processing modules using different fixtures. Thus, the spacing between components of the workpieces may be different in the different chambers. In such cases, the power module may adaptively adjust the DC voltage that is applied to each of the chamber based on the spacing of the workpieces in that chamber. More specifically, the power module may apply a lower voltage to a chamber that has closely spaced workpieces and further apply a higher voltage to a chamber that has widely spaced workpieces. In this way, the power module may be configured to adjust the voltage to maintain hollow cathode condition in each of the processing chambers.

The deposition system (1500) may additionally include a controller module (1510) configured operably coupled to the one or more processing modules (1502), the gas module (1504), the pressure module (1506), and the power module (1508). The controller can have a memory that stores computer readable instructions that, when executed by the controller, causes the controller to load and unload coating formulas using a user interface. The formulas may be designed based on the type of workpieces to be coated and/or the complex geometries of the workpieces. The controller additionally determines which processing module of the plurality of processing modules is being used for coating workpieces and accordingly regulates gas delivery via the first valve, regulates pressure of the chamber of the processing module being used, and further regulates the power supplied to the cathodes and the anodes. More specifically, once the controller determines which processing module is being used for coating workpieces, the controller may first perform safety checks and once the safety conditions are met, the controller may activate the appropriate chamber(s) of the processing module. Activating the chamber(s) may include electrically connecting the power supply to the selected chamber(s) and additionally include ensuring that the remaining chambers are grounded. The controller may additionally ensure that all the appropriate access doors of the selected chamber(s) are locked. Further, the controller may identify all the valves to be used for gas delivery and for applying vacuum to the selected chamber (s).

As an example, the controller may pump down the selected chamber(s) using the bypass valve(s) and further evacuate the selected chamber(s) by opening second valve (s). Herein, the second valves may include pendulum isolation valves. The controller may test the vacuum established inside the selected chamber(s) by closing the valves, and may start monitoring the pressure inside the selected chamber(s). In some embodiments, the controller may ensure that the other chambers that are not being used are vented, so that the operator may be able to load workpieces, in parallel, to increase throughout of the system. In some embodiments, the controller may additionally ensure that the other chambers that are not being used are grounded.

The controller may initialize cleaning and coating sequence in the selected chamber(s). As such the cleaning and coating sequence may include adjusting and controlling gas flow, pressure control, voltage/power and pulse condition, time for each step(s) for: (i) cleaning surfaces of the workpieces, (ii) forming adhesion layer(s), (iii) coating layer(s) on the workpieces, and (iv) purging the chamber(s). As such, the type of gas that is supplied to the chamber(s) may be based on the coating recipe that is loaded, for example. The controller may adjust gas flow, pressure, voltage/power, and pulse condition to establish hollow cathode condition in the chamber of the processing module being used, thus generating plasma to uniformly coat the workpieces of the processing module being used. In this way, the system coats internal and external surfaces of the workpieces arranged in any arrangement within the chamber. Once the coating process is completed, the controller may electrically ground the selected chamber(s), vent, and unlocks appropriate access doors of the selected chamber(s) to access the workpieces inside the chamber(s).

In this way, the deposition system may be used to simultaneously operate multiple processing chambers having different types of workpieces. Thus, the deposition system of the present invention allows for streamlining production cycles and maintaining complete control of the coating processes and the final product.

As used herein, the term "about" refers to plus or minus 10% of the referenced number.

The disclosures of the following U.S. Patents are incorporated in their entirety by reference herein: U.S. Pat. Nos. 7,300,684, 8,343,593 and U.S. Pat. Pub. No. 2007/0262059 A1.

Various modifications of the invention, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting of", and as such the written description requirement for claiming one or more embodiments of the present invention using the phrase "consisting of" is met.

The reference numbers recited in the below claims are solely for ease of examination of this patent application, and are exemplary, and are not intended in any way to limit the scope of the claims to the particular features having the corresponding reference numbers in the drawings.

What is claimed is:

1. A chemical vapor deposition system (150) for coating one or more workpieces (119), the system comprising:
   a. an openable hollow chamber (101) comprising (i) a first end (113), (ii) an opposing second end (115), (iii) an interior space (117) between the first end (113) and the second end (117), and (iv) a movable door (111) for accessing the interior space (117) of the chamber (101);
   b. a conductive, modular, and removable tubular shield (103) lining an interior surface of the chamber (101), wherein the tubular shield (103) is sized to fit within the interior space (117) of the chamber (101), wherein the tubular shield (103) is in face-sharing contact with the interior surface of the chamber (101), wherein the tubular shield (103) is effective to prevent deposition of the coating onto the interior surface of the chamber (101), wherein the tubular shield (103) is configured to be removed from the chamber (101) via the movable door (111) of the chamber (101);

c. one or more anodes (125) positioned on the first and second ends (113, 115) of the chamber (101); and d. a DC power supply (131) operably coupled to the chamber (101), wherein the DC power supply (131) is configured to apply a negative pulse for biasing the one or more workpieces (119) and the chamber (101) as cathodes, wherein a negative bias is additionally applied to the tubular shield (103) such that tubular shield (103) is biased, wherein the one or more workpieces (119) are loaded and unloaded from the chamber (101) via the moveable door (111), wherein the workpieces are positioned inside the interior space (117) of the chamber (101) in a predetermined arrangement that allows for a hollow cathode effect to occur in the interior space (117) of the chamber (101), wherein a reactive gas (129) is introduced into the interior space (117) of the chamber (101) at a pressure controlled to achieve a plasma that uniformly coats the one or more workpieces (119), wherein the movable door (111) and tubular shield (103) allows for ease of cleaning and inspection of the interior space (117) of the chamber (101).

2. The system of claim 1, wherein one or more of an external surface and an internal surface of each workpiece (119) is coated.

3. The system of claim 1, wherein the DC power supply (131) is a pulsed DC power supply configured to apply a reverse pulse to the cathodes to discharge growing coating.

4. The system of claim 1, wherein a geometry of the chamber (101) comprises a circular cross-section, wherein a longitudinal axis of the chamber (101) extends perpendicular to the circular cross section.

5. The system of claim 4, wherein the tubular shield (103) is centered along the longitudinal axis.

6. The system of claim 1, wherein the tubular shield (103) comprises a first panel (105) for lining a portion of the interior surface of the chamber (101), and a second panel (107) for lining the remaining portion of the interior surface.

7. The system of claim 1, wherein the tubular shield (103) comprises a foil fitted within the interior space (117) of the chamber (101) and wherein the foil is removed via the door (111) and recycled or discarded after the coating is applied to the one or more workpieces (119).

8. The system of claim 1, wherein after coating, the tubular shield (103) is removed from the chamber (101) via the movable door (111) of the chamber (101), and wherein the tubular shield (103) is reworked and reused for a subsequent coating process.

9. The system of claim 1, wherein the negative pulse applied to cathodes is adjusted to maintain the hollow cathode effect within the interior space (117) of the chamber (101).

10. The system of claim 1, further comprising a rack fixture (133) for supporting and holding the workpieces (119) in the predetermined arrangement inside the chamber (101).

11. The system of claim 1, wherein the predetermined arrangement comprises a spacing between the workpiece and the tubular shield (103), and a predetermined spacing between workpieces (119).

12. The system of claim 1, wherein the reactive gas (129) is delivered via one or more gas lines (143) coupled to the chamber (101).

13. A chemical vapor deposition system for coating one or more workpieces, said system comprising: a. a plurality of processing chambers (135), wherein each chamber (101) of the plurality of processing chambers is hollow and includes (i) a first end (113), (ii) a second opposite end (115), (iii) an interior space (117) between the first end (113) and the second end (115), (iv) a movable door (111) for accessing the interior space (117) of the chamber (101), (v) a conductive and removable shield (103) lining an inside of the chamber (101), and (vi) one or more fixtures (133) coupled to one or both of the first end (113) the second end (115), the fixtures (133) configured to position one or more workpieces (119) within the interior space (117), wherein the fixtures (133) are modular and is configured to vary a spacing between individual workpieces of the one or more workpieces, b. a plurality of anodes (125) operatively coupled to each of the plurality of processing chambers (135); c. a pulsed DC power supply (131) operatively coupled to each of the plurality of processing chambers (135), wherein when the workpieces (119) are positioned inside at least one of the processing chambers (135), the DC power supply (131) is configured to apply a large negative pulse for biasing said chamber and the one or more workpieces (119) as cathodes, wherein the shield (103) is in face-sharing contact with an interior surface of the chamber (101), wherein a negative bias is additionally applied to the shield (103) such that the shield (103) is biased, wherein the shield (103) is configured to be removed from the chamber (101) via the movable door (111) of the chamber (101), wherein the plurality of processing chambers (135) are each operatively coupled to a gas line (143), wherein the gas line (143) is configured to supply reactive gas (129) to the interior space (117) of the chamber (101) at a pressure controlled to achieve a plasma that uniformly coats the one or more workpieces (119), wherein the spacing of the workpieces relative to each other and to the chamber is selected to maintain a hollow cathode effect in the interior space (117), and wherein each of the plurality of processing chambers is individually and independently operable to coat the workpieces, wherein when at least one chamber is being used to coat the workpieces, the remaining chambers are not biased, thus allowing for independent operation of each chamber, wherein the processing chambers can operate in parallel or in series to each other.

14. The deposition system of claim 13, wherein each chamber (101) is operably coupled to a vacuum pump (127), and when the one or more workpieces (119) are coated within the chamber (101), the vacuum pump (127) is operated to maintain the interior space (117) of the chamber (101) in vacuum, and wherein one or both of internal and external surfaces of the workpieces, in any arrangement, are coated.

15. The deposition system of claim 13, wherein for each chamber of the plurality of processing chambers, one or more workpieces are loaded and unloaded via the moveable door (111).

16. The deposition system of claim 13, wherein the shield (103) is a foil fitted within the interior space (117) of the chamber (101) and wherein the foil is removed via the door (111) and recycled or discarded after the coating is applied to the one or more workpieces.

17. The deposition system of claim 13, wherein the shield (103) is modular and tubular in shape, and includes a first panel (105) and a second panel (107) that overlap and interlock to create a shield within the chamber, wherein after coating, the tubular shield lining is removed from the chamber via the movable door (111) of the chamber, and wherein the tubular shield (103) is reworked and reused for a subsequent coating process.

18. The deposition system of claim 13, wherein a design of the fixture (133) is based on a geometry of the one or more workpieces (119) and wherein the design is further configured to maintain a threshold spacing between individual components of the workpieces.

19. The deposition system of claim 18, wherein the threshold spacing is selected from either a minimum dimension of the individual components of the workpieces or a fixed separation value, whichever is lower, wherein the threshold spacing is configured to maintain the hollow cathode condition within the interior space (117).

20. The deposition system of claim 13. wherein the gas line (143) is configured to supply a cleaning gas to each chamber of the plurality of processing chambers, wherein the cleaning gas is configured to clean the interior space of the chamber prior to and after each deposition run.

* * * * *